United States Patent
Kim et al.

(10) Patent No.: US 9,001,588 B2
(45) Date of Patent: Apr. 7, 2015

(54) SENSE AMPLIFIER FOR NONVOLATILE SEMICONDUCTOR MEMORY DEVICE

(71) Applicant: Samsung Electronics Co., Ltd., Gyeonggi-do (KR)

(72) Inventors: Eui-Seung Kim, Gyeonggi-do (KR); Ji-Sung Kim, Seoul (KR); SeEun O, Gyeonggi-do (KR)

(73) Assignee: Samsung Electronics Co., Ltd., Suwon-Si, Gyeonngi-Do (KR)

( * ) Notice: Subject to any disclaimer, the term of this patent is extended or adjusted under 35 U.S.C. 154(b) by 167 days.

(21) Appl. No.: 13/715,471

(22) Filed: Dec. 14, 2012

(65) Prior Publication Data

US 2013/0201761 A1    Aug. 8, 2013

(30) Foreign Application Priority Data

Feb. 6, 2012  (KR) .................. 10-2012-0011923

(51) Int. Cl.

| | | |
|---|---|---|
| G11C 16/06 | (2006.01) | |
| G11C 7/00 | (2006.01) | |
| G11C 7/06 | (2006.01) | |
| G11C 27/00 | (2006.01) | |
| G11C 16/28 | (2006.01) | |
| G11C 11/56 | (2006.01) | |

(52) U.S. Cl.
   CPC .............. *G11C 16/28* (2013.01); *G11C 11/56* (2013.01)

(58) Field of Classification Search
   CPC ........ G11C 16/28; G11C 11/56; G11C 27/00; G11C 7/062; G11C 7/14; G11C 7/067; H03K 5/24; H03K 5/22
   USPC ................... 365/185.21, 208, 185.2
   See application file for complete search history.

(56) References Cited

U.S. PATENT DOCUMENTS

| | | | |
|---|---|---|---|
| 5,198,997 A | | 3/1993 | Arakawa |
| 5,258,669 A | * | 11/1993 | Nakashima ..................... 327/51 |
| 6,034,888 A | * | 3/2000 | Pasotti et al. ............ 365/185.03 |
| 6,172,923 B1 | | 1/2001 | Liu |
| 6,337,825 B2 | * | 1/2002 | Tanzawa et al. ............. 365/207 |
| 6,504,761 B2 | | 1/2003 | Kai et al. |
| 6,898,124 B1 | | 5/2005 | Wang et al. |
| 7,269,058 B2 | | 9/2007 | Frulio et al. |
| 7,483,306 B2 | | 1/2009 | Lin |
| 7,512,026 B2 | | 3/2009 | O |
| 7,609,555 B2 | | 10/2009 | O |
| 7,800,968 B2 | | 9/2010 | Kern |
| 7,961,521 B2 | * | 6/2011 | O ............................ 365/185.21 |
| 2009/0154249 A1 | * | 6/2009 | Pasotti et al. ............ 365/185.21 |
| 2010/0008147 A1 | | 1/2010 | O |
| 2011/0069554 A1 | | 3/2011 | Lo Giudice et al. |

FOREIGN PATENT DOCUMENTS

| | | |
|---|---|---|
| JP | 2006019003 | 1/2006 |
| KR | 1020060000777 A | 1/2006 |

* cited by examiner

*Primary Examiner* — J. H. Hur
*Assistant Examiner* — Xiaochun L Chen
(74) *Attorney, Agent, or Firm* — F. Chau & Associates, LLC

(57) ABSTRACT

A sense amplifier circuit of a nonvolatile semiconductor memory device is provided. The sense amplifier circuit includes a reference voltage generator, a sensing voltage generator and a comparator. The sensing voltage generator outputs a sensing voltage to a sensing node depending on a current flowing through a data line. A load transistor supplying a current to the data line is directly connected to a clamping node. The load transistor is included in a current mirror circuit. In a read operation, a low voltage drive operation is performed and a sensing speed and power consumption are properly controlled.

19 Claims, 8 Drawing Sheets

SENSE AMPLIFIER FOR NONVOLATILE SEMICONDUCTOR MEMORY DEVICE

CROSS-REFERENCE TO RELATED APPLICATIONS

This U.S. non-provisional patent application claims priority under 35 U.S.C. §119 of Korean Patent Application No. 10-2012-0011923, filed on Feb. 6, 2012, the entire contents of which are hereby incorporated by reference.

BACKGROUND

Embodiments of the present inventive concept herein relate to semiconductor memory devices, and more particularly to a sense amplifier for a nonvolatile semiconductor memory device.

Examples of nonvolatile semiconductor memory devices include mask ROMs, electrically erasable and programmable read only memories (EEPROMs), erasable and programmable read only memories (EPROMs), etc. EEPROMs can perform an electrical erase operation and an electrical write operation. EEPROMs have numerous applications, including system programming updating or serve as auxiliary memory devices. Flash EEPROMs (hereinafter referred to as 'flash memory devices'.), highly integrated as compared with conventional EEPROMs, may be used for mass storage auxiliary memory devices.

Flash memory devices may be divided into NAND-type flash memory devices, NOR-type flash memory devices, and AND-type flash memory devices. The NAND-type flash memory devices have a relatively high integration due to the features of memory cell arrays thereof. The NOR-type flash memory devices are less integrated compared to other types of flash memory devices, but have a relatively high data access speed. Accordingly, the NOR-type flash memory devices are widely used in mobile electronic devices.

SUMMARY

An embodiment of the inventive concept provides a sense amplifier circuit of a nonvolatile semiconductor memory device. The sense amplifier circuit may include a reference voltage generator configured to output a reference voltage to a reference node depending on a current flowing through a reference data line connected to a reference bit line, a sensing voltage generator configured to output a sensing voltage to a sensing node depending on a current flowing through a data line connected to a bit line, and a comparator configured to sense and amplify a difference between the reference voltage of the reference node and the sensing voltage of the sensing node to detect data stored in a memory cell connected to the bit line.

An embodiments of the inventive concept provides a nonvolatile semiconductor memory device. The nonvolatile semiconductor memory device may include a memory cell array comprising memory cells arranged at intersections between a plurality of word lines and a plurality of bit lines, a decoder configured to select a word line and a bit line of the memory cell array, and a sense amplifier circuit configured to sense data stored in a selected memory cell by detecting a current flowing through a selected bit line. The sense amplifier circuit comprises a reference voltage generator configured to output a reference voltage to a reference node depending on a current flowing through a reference data line connected to a reference bit line, a sensing voltage generator configured to output a sensing voltage to a sensing node depending on a current flowing through a data line connected to a bit line, and a comparator configured to sense and amplify a difference between the reference voltage of the reference node and the sensing voltage of the sensing node to detect data stored in a memory cell connected to the bit line.

According to an embodiment, there is provided a sense amplifier circuit of a semiconductor memory device including a reference voltage generator connected to a reference data line, wherein the reference voltage generator includes a current mirror having a load transistor connected to the reference data line, a sensing voltage generator connected to a data line, wherein the sensing voltage generator includes a current mirror having a load transistor connected to the data line, and a comparator configured to output sensing data in response to a reference voltage provided from the reference voltage generator and a sensing voltage provided from the sensing voltage generator.

DETAILED DESCRIPTION OF THE EMBODIMENTS

Figure 1:
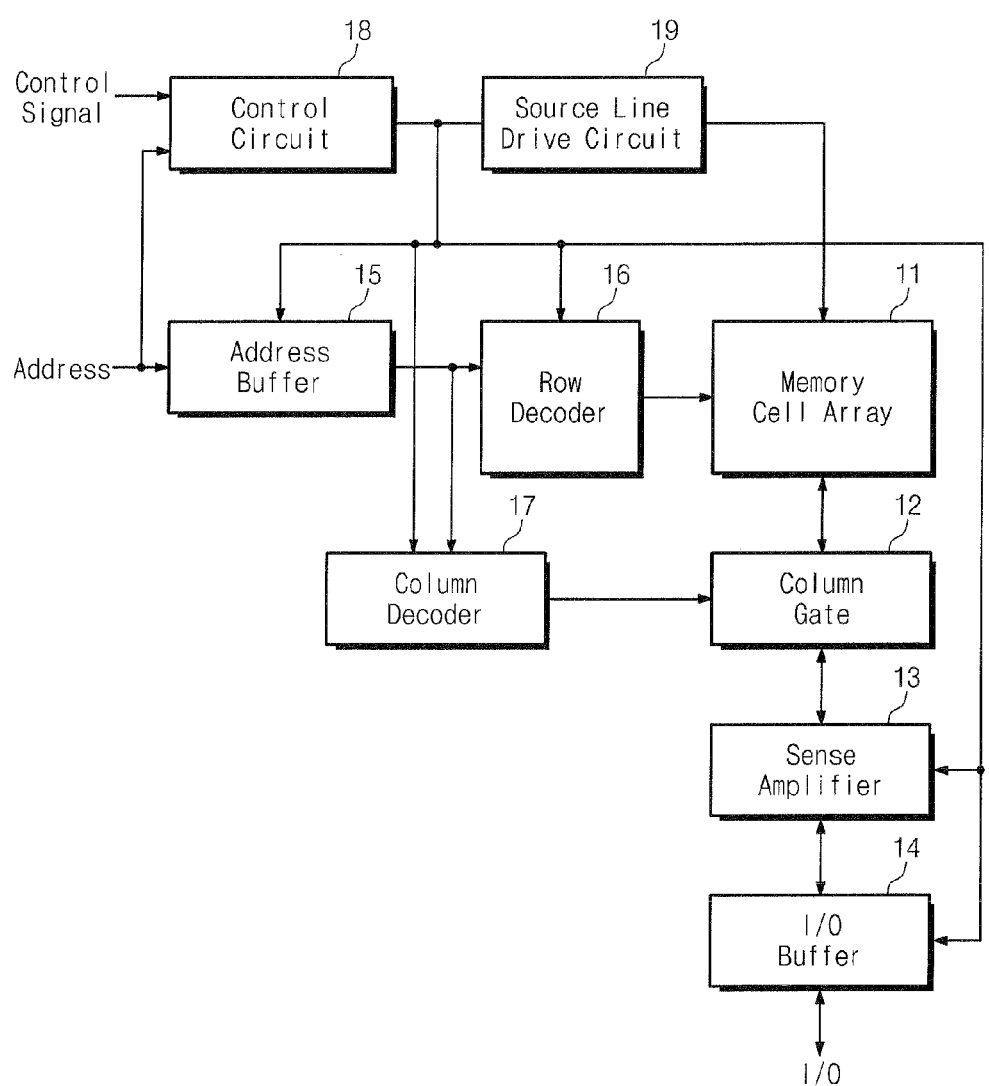
FIG. 1 is a block diagram of a nonvolatile semiconductor memory device in accordance with an embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. In the drawings, the size and relative sizes of layers and regions may be exaggerated for clarity. Like numbers may refer to like or similar elements throughout the specification and the drawings.

It will be understood that when an element is referred to as being "connected" or "coupled" to another element, it can be directly connected or coupled to the other element or intervening elements may be present.

FIG. 1 is a block diagram of a nonvolatile semiconductor memory device in accordance with an embodiment of the inventive concept.

Referring to FIG. 1, a nonvolatile semiconductor memory device, such as a NOR-type flash memory device, includes a memory cell array 11, a column gate 12, a sense amplifier circuit 13, an I/O buffer 14, an address buffer 15, a row decoder 16, a column decoder 17, a control circuit 18 and a source line drive circuit 19.

The memory cell array 11 has a matrix structure of row and column of memory cells which include MOS transistors having floating gate and control gate. A drain and a source of an MOS transistor may be connected to a bit line and a common source line, respectively.

A program operation of a memory cell may be accomplished by injecting electrons into a floating gate of a transistor. When electrons are injected into the floating gate of the transistor, a threshold voltage of the transistor is increased. The increase of the threshold voltage may be defined as data '0' being stored in a memory cell.

An erase operation of a memory cell may be accomplished by discharging electrons out of a floating gate of a transistor. When electrons are discharged from the floating gate of the transistor, a threshold voltage of the transistor is decreased, and the decrease of the threshold voltage may be defined as data '1' being stored in the memory cell. A memory cell having a high threshold voltage is referred to as a programmed cell or an off-cell, and a memory cell having a low threshold voltage is referred to as an erased cell or an on-cell.

The control circuit 18 receives a control signal and an address and generates an internal control signal to control set operation modes.

The source line drive circuit 19 drives a common source line jointly connected to memory cells at a voltage level set in the set operation modes in response to the internal control signal. Accordingly, the common source line is set to a level of ground voltage in, e.g., a read operation mode.

The address buffer 15 receives an address and performs a buffering operation. In response to the internal control signal, the address buffer 15 provides a row address for selecting a row of the memory cell array 11 to the row decoder 16 and provides a column address for selecting a column of the memory cell array 11 to the column decoder 17.

The row decoder 16 decodes the row address in response to the internal control signal. When a result of the row address decoding is applied to the memory cell array 11, a word line selected among a plurality of word lines connected to memory cells is driven.

The column decoder 17 decodes the column address in response to the internal control signal.

The column gate 12 performs column gating according to the decoded column address. As a result of the column gating, one of bit lines connected to memory cells is driven.

The sense amplifier circuit 13 detects a current flowing through a bit line of a selected memory cell and senses data stored in the selected memory cell.

The I/O buffer 14 buffers input and output data. In a read operation mode, the I/O buffer 14 buffers data read from the sense amplifier circuit 13 and outputs the buffered data to an I/O terminal.

When the nonvolatile memory device of FIG. 1 is a NOR-type flash memory device, the nonvolatile memory device may be adopted for battery operating systems, such as smart card systems or high speed and large capacity electronic devices, and may be subjected to low voltage driving and low power consumption.

Figure 2:
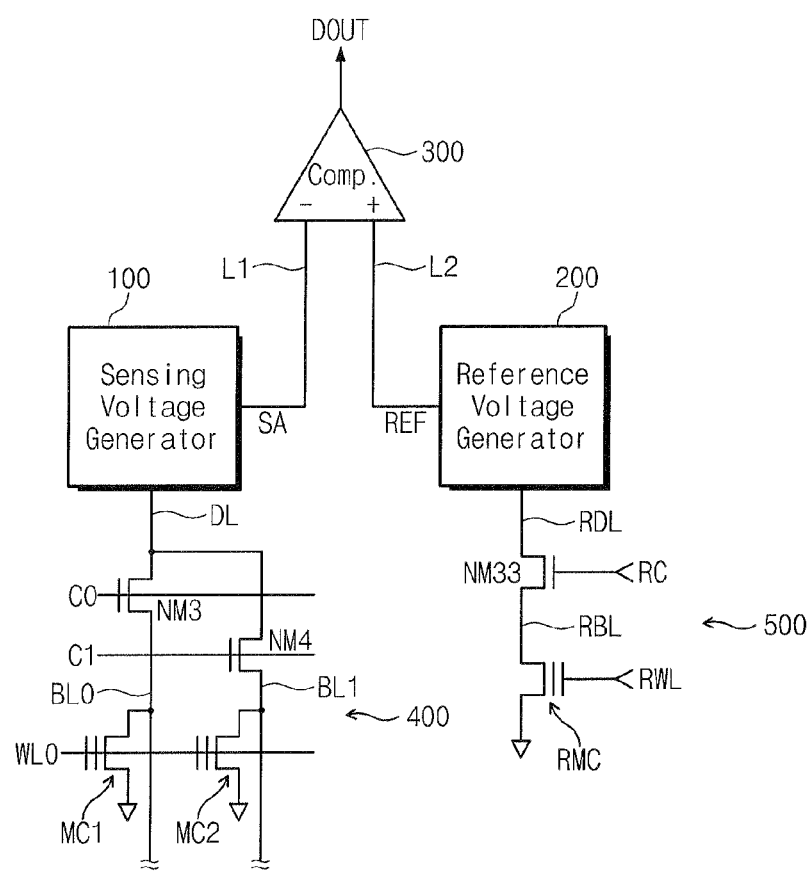
FIG. 2 is a circuit diagram illustrating a connection structure between a sense amplifier circuit and a memory cell array as illustrated in FIG. 1.

In a read operation, as a driving voltage of the sense amplifier increases, a sensing speed may increase. In the same driving voltage, as the sensing speed increases, power consumption increases. A sense amplifier as illustrated in FIG. 2 may result in a low voltage driving operation in a read operation. A sensing current may be directly controlled, so that a sensing speed and power consumption are suitably controlled.

FIG. 2 is a drawing illustrating a connection structure between a sense amplifier circuit and a memory cell array as illustrated in FIG. 1.

Referring to FIG. 2, a sense amplifier circuit of a nonvolatile semiconductor memory device includes a sensing voltage generator 100, a reference voltage generator 200 and a comparator 300.

The reference voltage generator 200 generates a reference voltage to a reference node REF depending on a current flowing through a reference data line RDL connected to a reference bit line RBL.

The sensing voltage generator 100 generates a sensing voltage to a sensing node SA depending on a current flowing through a data line DL connected to a bit line BL0 or BL1. The sensing voltage generator 100 is configured so that a load transistor (PM2 of FIG. 4) providing a current to the data line DL is directly connected to a clamping node (Nl1 or DL) and is controlled as part of a current mirror circuit. For example, the current mirror circuit includes the transistors PM1 and PM2.

The comparator 300 senses and amplifies a difference between a reference voltage of the reference node REF and a sensing voltage of the sensing node SA and detects data stored in a memory cell (e.g., MC1) connected to the bit line (e.g., BL0).

For instance, for purposes of description, in a read operation mode, the memory cell MC1 is selected and data '0' is stored in the memory cell MC1. A word line WL0 and a bit line BL0 are selected by a decoder. A column gate NM3 is turned on by a column gating signal C0 and thereby the data line DL and the bit line BL0 are connected to each other. When a reference cell RMC is driven and a reference column gate NM33 is turned on by a reference column gating signal RC, the reference data line RDL and a reference bit line RBL are connected to each other. A threshold voltage of the reference cell RMC may be set to be a middle level between a threshold voltage of the on-cell and a threshold voltage of the off-cell.

Since the memory cell MC1 is an off-cell storing data '0', a current flowing from the data line DL to the bit line BL0 is relatively less than a current flowing from the reference data line RDL to the reference bit line RBL due to a high threshold voltage.

Thus, a sensing voltage of the sensing node SA becomes high as compared with a reference voltage of the reference node REF. The comparator 300 connected to the sensing node SA and the reference node REF through sensing lines L1 and L2 senses and amplifies a difference between a sensing voltage of the sensing node SA and a reference voltage of the reference node REF. According to an embodiment, the comparator 300 outputs data '0' as a sensing data output DOUT.

Figure 3:
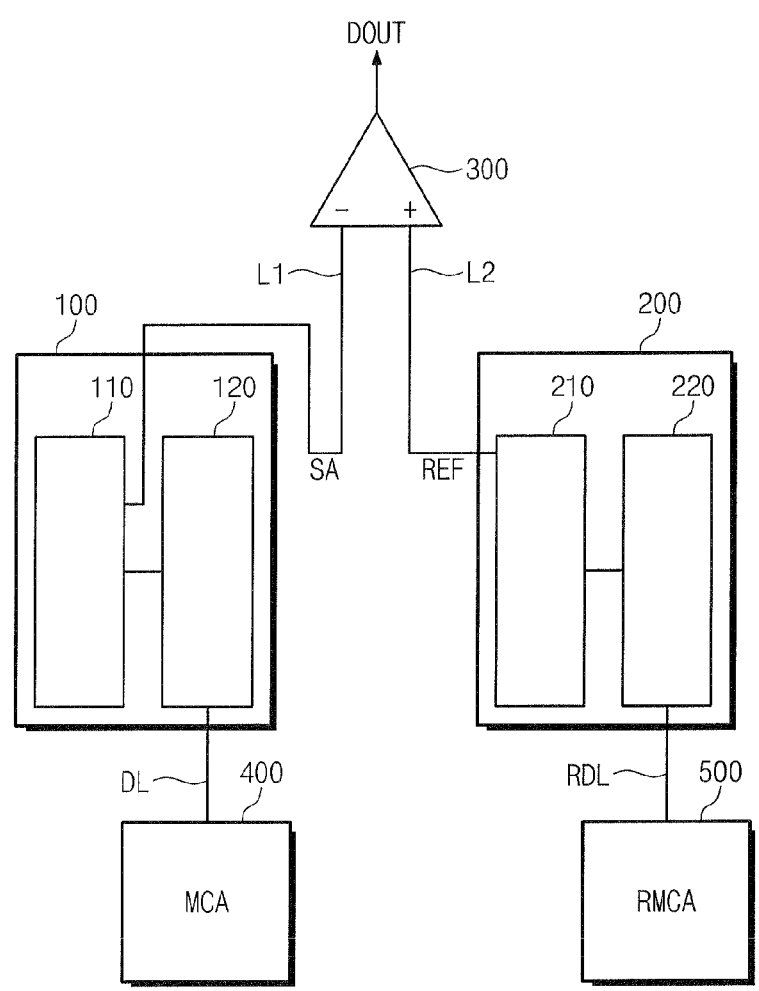
FIG. 3 is a block diagram specifically illustrating the sense amplifier of FIG. 2.

The sensing voltage generator 100 can perform a low voltage driving operation in a read operation and can easily perform direct control on a sensing current by a current supply part and a regulating control part as illustrated in FIG. 3.

FIG. 3 is a block diagram specifically illustrating the sense amplifier in FIG. 2.

Referring to FIG. 3, the sensing voltage generator 100 includes a current supply part 120 including a load transistor connected between a power supply part and the clamping node and controlled by a sensing voltage of the sensing node and a regulating control part 110 connected to the current supply part 120 and the power supply part and regulating a clamping voltage set to the clamping node.

Similarly, the reference voltage generator 200 may include a reference current supply part 220 and a reference regulating control part 210.

Figure 4:
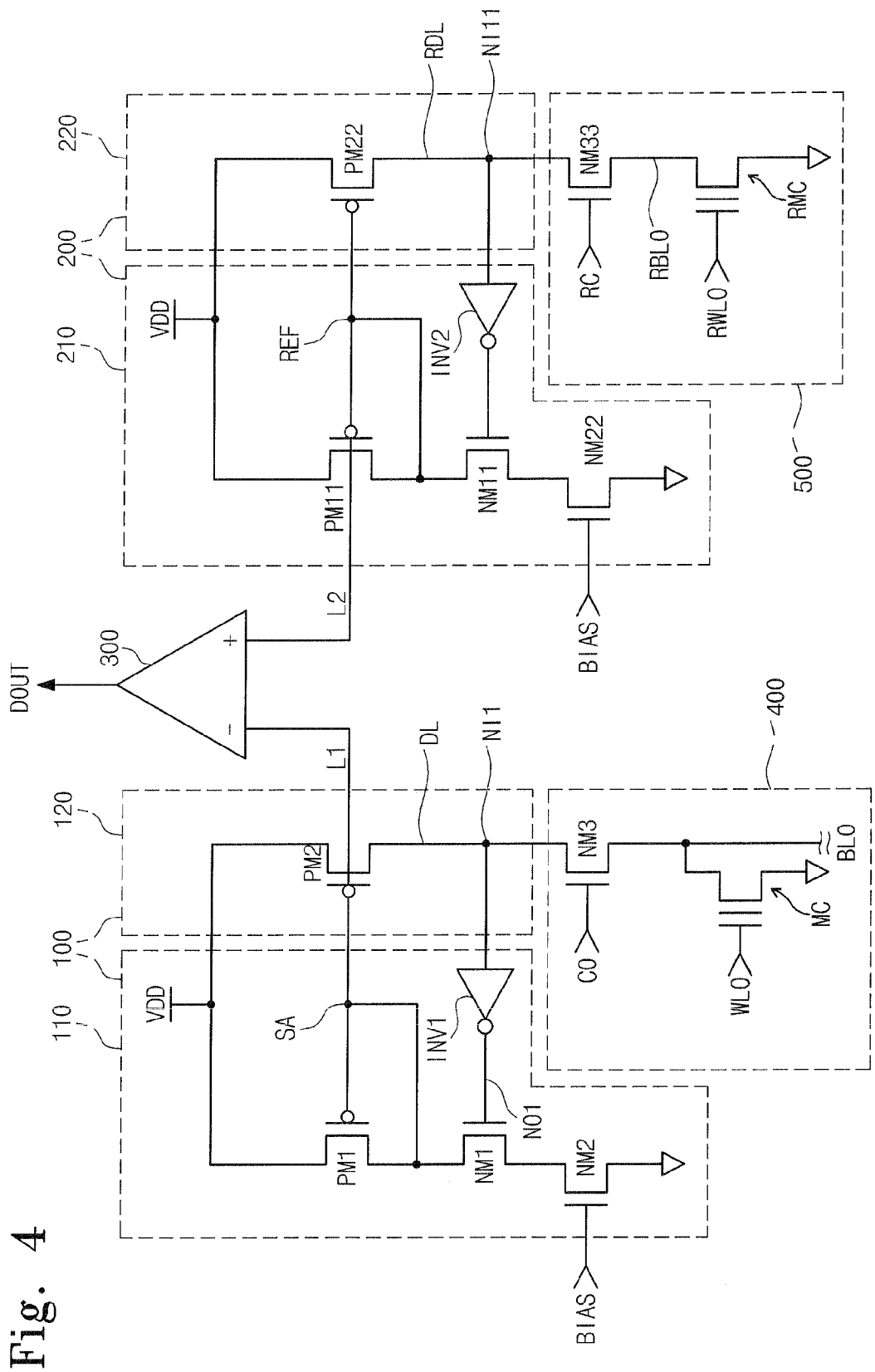
FIG. 4 is a circuit diagram more specifically illustrating the sense amplifier of FIG. 3.

A specific embodiment of the current supply part 120 and the regulating control part 110 is illustrated in FIG. 4.

FIG. 4 is a circuit diagram more specifically illustrating the sense amplifier of FIG. 3.

Referring to FIG. 4, the current supply part 120 includes a PMOS transistor PM2 that functions as a load transistor.

The regulating control part 110 includes a PMOS transistor PM1 which includes gate and drain connected to a gate of the load transistor and a source connected to the power supply part VDD and constitutes a current mirror structure with the load transistor PM2; a NMOS transistor NM1 which includes a drain connected to the drain of the PMOS transistor PM1; a NMOS transistor NM2 which includes a drain-source channel connected between a source of the NMOS transistor NM1 and a ground terminal and a gate that receives a bias voltage BIAS; and an inverter INV1 that generates an inverting output depending on a voltage change at the clamping node (Nl1 or DL) and applies the inverting output to a gate of the NMOS transistor NM1.

The reference current supply part 220 of the reference voltage generator 200 includes a PMOS transistor PM22 that functions as a load transistor.

The reference regulating control part 210 includes a PMOS transistor PM11 which includes gate and drain connected to a gate of the load transistor PM22 and a source connected to the power supply part VDD and constitutes a current mirror structure with the load transistor PM22; a NMOS transistor NM11 which includes a drain connected to the drain of the PMOS transistor PM11; a NMOS transistor NM22 which includes a drain-source channel connected between a source of the NMOS transistor NM11 and a ground terminal and a gate that receives a bias voltage BIAS; and an inverter INV2 that generates an inverting output depending on a voltage change at the clamping node (Nl11 or RDL) and applies the inverting output to a gate of the NMOS transistor NM11.

The sensing voltage generator 100 generates a sensing voltage to the sensing node depending on a current flowing through the data line DL connected to a bit line. The sensing voltage generator 100 is configured so that the load transistor PM2 providing a current to the data line DL is directly connected to a clamping node (DL or Nl1) and is controlled as part of a current mirror circuit. For example, the current mirror circuit includes the transistors PM1 and PM2

When a voltage of the clamping node (DL or Nl1) is set to be 0.5V, a voltage of the power supply part VDD may become lower than 0.9V.

A minimum voltage to drive the regulating control part 110 is about 0.9V which is the sum of a threshold voltage Vthp (0.5V) of the PMOS transistor PM1 having a diode structure, a drain-source voltage Vds (0.2V) of the NMOS transistor NM1 and a drain-source voltage Vds (0.2V) of the NMOS transistor NM2.

A minimum voltage to drive the current supply part 120 is about 0.7V which is the sum of a source-drain voltage Vp_ds (0.2V) of the load transistor PM2 and a clamping voltage 0.5V of the clamping node. The minimum voltage to drive the current supply part 120 is lower than the minimum voltage to drive the regulating control part 110 since the load transistor PM2 directly supplies a current to the clamping node Nl_1 without passing through any other transistors.

Thus, even when a voltage of the power supply part VDD is a low voltage of 0.9V, a data sensing operation of the sense amplifier circuit can be performed without an error.

In the case of NOR-type flash semiconductor devices, a process design rule may be limited to 45 nanometers or less according to requirements of high integration and high capacity. Since a driving voltage used for the NOR-type flash semiconductor devices can be designed to be 1.0 V or less, a driving voltage of the sense amplifier circuit may be designed to be a low voltage. For example, in a 45 nm process, the sense amplifier circuit may operate in a range of about 0.99 V to about 1.21 V.

A sensing speed of data is controlled by controlling a bias voltage BIAS applied to a gate of the NMOS transistor NM2. When the bias voltage BIAS is controlled to be relatively high, a sensing speed increases but power consumption becomes relatively large as well. When the bias voltage BIAS is controlled to be relatively low, a sensing speed decreases but power consumption becomes relatively small. Thus, the bias voltage BIAS can be controlled to be suitable for use of an electronic device.

Figure 5:
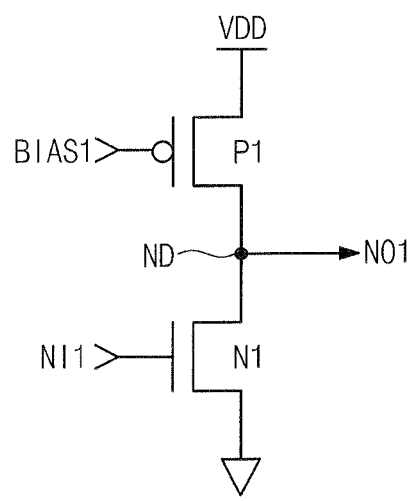
FIG. 5 is a circuit diagram specifically illustrating an inverter as shown in FIG. 4.

In FIG. 4, a voltage of the clamping node (DL, Nl1) may be regulated by an inverter INV1 as illustrated in FIG. 5.

FIG. 5 is a circuit diagram specifically illustrating an inverter as shown in FIG. 4. Although it is described that the inverter of FIG. 5 is the inverter INV1 of FIG. 4, according to an embodiment, the inverter of FIG. 5 may be the inverter INV2 of FIG. 4.

Referring to FIG. 5, the inverter INV1 includes a PMOS transistor P1 which includes a gate through which a bias voltage BIAS 1 is received and a source connected to a first supply voltage VDD and an NMOS transistor N1 which includes a drain-source channel connected between an output connection node ND, which is connected to a drain of the PMOS transistor P1, and a ground VSS.

Referring back to FIG. 4, a trip section of the inverter INV1 is set to be wider than a trip section of a conventional inverter. When a voltage of the clamping node Nl1 becomes lower than 0.5V, the inverter increases an electric potential of the output connection node ND. When a voltage of the clamping node Nl1 becomes higher than 0.5V, the inverter INV1 decreases an electric potential of the output connection node ND.

When a voltage of the clamping node Nl1 becomes lower than 0.5V and thereby an electric potential of the output connection node ND increases, the NMOS transistor NM1 of which a gate is connected to a line N01 is strongly turned on. As a result, the amount of current flowing into the ground terminal through first and second NMOS transistors NM1 and NM2 increases. Accordingly, a voltage of the sensing node SA decreases and thereby the load transistor PM2 is strongly turned on. As a result, a voltage of the clamping node Nl 1 increases and maintains 0.5V.

When a voltage of the clamping node Nl1 becomes higher than 0.5V and thereby an electric potential of the output connection node ND decreases, the NMOS transistor NM1 of which a gate is connected to a line N01 is weakly turned on or turned off. As a result, the amount of current flowing into the ground terminal through the first and second NMOS transistors NM1 and NM2 is reduced or blocked out. Thus, a voltage of the sensing node SA increases and thereby the load transistor PM2 is weakly turned on. A voltage on the clamping node Nl 1 decreases again and maintains 0.5V.

A trip section of the inverter INV1 may be widened or narrowed by controlling a level of the bias voltage BIAS. To perform a stable read operation, the trip section may be properly controlled.

Figure 6:
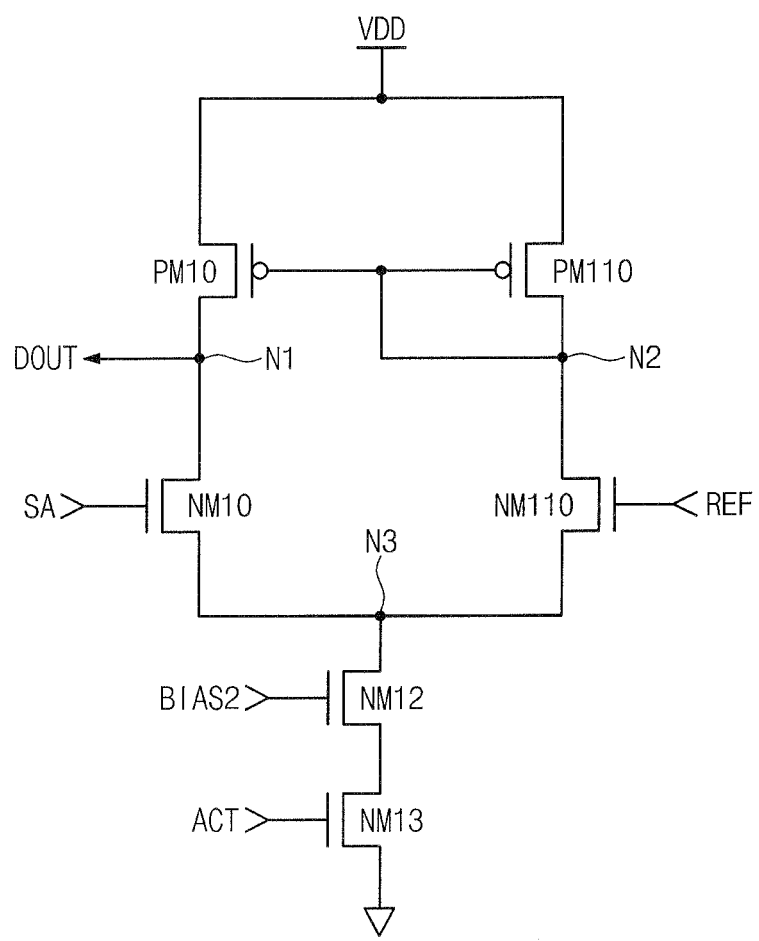
FIG. 6 is a circuit diagram specifically illustrating the comparator of FIG. 4.

FIG. 6 is a circuit diagram specifically illustrating the comparator of FIG. 4.

Referring to FIG. 6, the comparator 300 includes a current mirror type differential amplifier which is driven in response to an enable signal ACT. The comparator 300 includes a first input terminal connected to the sensing node SA and a second input terminal connected to the reference node REF.

In FIG. 6, gates of PMOS transistors PM10 and PM110 are connected to each other to form a current mirror circuit. A gate of NMOS transistor NM10 becomes a first input terminal, and a gate of NMOS transistor NM110 becomes a second input terminal.

An NMOS transistor NM12 of which a drain is connected to a node N3 is driven in response to a bias voltage BIAS2.

An NMOS transistor NM13 of which a drain is connected to a source of the NMOS transistor NM12 is driven in response to the enable signal ACT. The enable signal ACT may be the same as a sense amplifier enable signal applied to a sense amplifier circuit when a read operation mode is performed or a control signal responding to the sense amplifier enable signal.

When the enable signal ACT is applied at a high level in a data read operation mode, an operation of the comparator 300 is enabled.

When a voltage of the sensing node SA is higher than a voltage of the reference node REF, the NMOS transistor NM10 is relatively strongly turned on as compared with the NMOS transistor NM110. Since the NMOS transistor NM110 is relatively weakly turned on, a voltage of node N2 slowly decreases. Accordingly, a gate voltage of the PMOS transistor PM10 slowly decreases and thereby the amount of current flowing through the PMOS transistor PM10 decreases. Consequently, a voltage of the node N1 begins to decrease and a voltage of the node N2 begins to increase. As time goes by, a difference between the voltage of the node N1 and the voltage of the node N2 increases. The comparator 300 outputs sensing output data as data '0'.

When a voltage of the sensing node SA is lower than a voltage of the reference node REF, the NMOS transistor NM10 is relatively weakly turned on as compared with the NMOS transistor NM110. Since the NMOS transistor NM110 is relatively strongly turned on, a voltage of node N2 quickly decreases. Accordingly, a gate voltage of the PMOS transistor PM10 quickly decreases and thereby the amount of current flowing through the PMOS transistor PM10 increases. Consequently, a voltage of the node N1 begins to increase and a voltage of the node N2 begins to decrease. As time goes by, a difference between the voltage of the node Ni and the voltage of the node N2 increases. The comparator 300 outputs sensing output data as data '1'.

Referring back to FIG. 4, when about 0.9V is applied to the power supply part VDD and a bias voltage BIAS is applied as a set DC voltage, a voltage of the data line DL may be set to be about 0.5V. A voltage of the reference data line RDL may also be set to be about 0.5V.

When a voltage of the data line DL increases to more than 0.5V, a current regulating operation of the NMOS transistor NM1 is performed by an operation of the inverter INV1. Thus, a voltage of the sensing node SA increases and the load transistor PM2 reduces the amount of current drive. A voltage of the data line DL is reduced toward 0.5V.

When a voltage of the data line DL decreases to below 0.5V, a current regulating operation of the NMOS transistor NM1 is performed as opposed to the previous current regulating by an operation of the inverter INV1. Thus, a voltage of the sensing node SA decreases and the load transistor PM2 increases the amount of current drive. A voltage of the data line DL increases toward 0.5V.

A read command directing a read operation mode may be received and a word line WL0 and a bit line BL0 of the memory cell MC may be selected by a decoding operation of the decoder. The column gate NM3 is turned on by a column gating signal C0 and thereby the data line DL and the bit line BL0 are connected to each other. For purposes of description, data '0' is stored in the memory cell MC and a reference bit line RBL0 to which a reference cell RMC is connected and the reference data line RDL are connected to each other by a reference column gate NM33. A threshold voltage of the reference cell RMC may be set to a middle level between threshold voltages of on-cell and off-cell.

Since the memory cell MC is an off-cell storing data '0', due to a high threshold voltage, the amount of current flowing from the data line DL to the bit line BL0 is much less than the amount of current flowing from the data line DL to the bit line BL0 when the memory cell MC is an on-cell. Accordingly, the NMOS transistor NM1 is weakly turned on or turned off, so that a voltage of the sensing node SA increases. When a voltage of the sensing node SA increases, a current drive of the load transistor PM2 is reduced. According to an embodiment, a voltage of the sensing node SA may be at least 0.4V. The load transistor PM2 is turned on enough to compensate for a penetration current ICELL flowing through the memory cell MC. Consequently, a level of the sensing node SA remains constant so that a read operation may be stabilized.

A voltage of the reference node REF may be at least 0.2V by the current mirror operation described above.

When a sensing voltage of the sensing node SA is higher than a reference voltage of the reference node REF, the comparator 300 senses and amplifies a difference between the sensing voltage of the sensing node SA and the reference voltage of the reference node REF. According to an embodiment, the comparator 300 outputs sensing output data DOUT as data '0'.

The sensing voltage generator 100 performs a low voltage drive operation in a read operation by the current supply part and the regulating control part. Direct mirroring control of a sensing current is easily performed.

In the case that the memory cell MC is an on-cell storing data '1', due to a low threshold voltage, the amount of current flowing from the data line DL to the bit line BL0 is much more than the amount of current flowing from the data line DL to the bit line BL0 when the memory cell MC is an off-cell.

Thus, the sense amplifier circuit operates as opposed to the description described above. When a sensing voltage of the sensing node SA is lower than a reference voltage of the reference node REF, the comparator 300 senses and amplifies a difference between the sensing voltage of the sensing node SA and the reference voltage of the reference node REF. According to an embodiment, the comparator 300 outputs sensing output data DOUT as data '1'.

Figure 7:
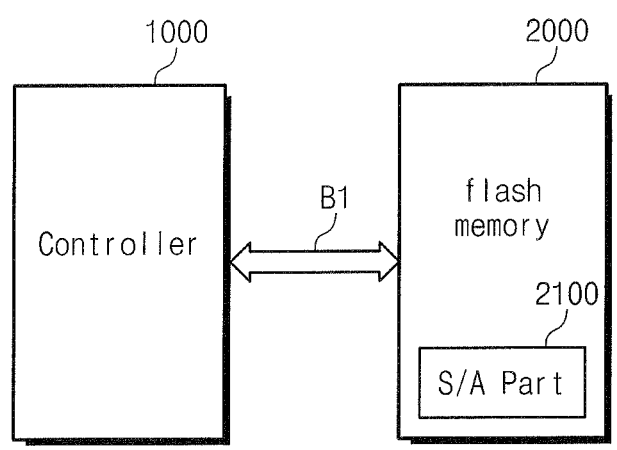
FIG. 7 is a block diagram illustrating a memory system to which a sense amplifier circuit according to an embodiment of the present invention applies.

FIG. 7 is a block diagram illustrating a memory system to which a sense amplifier circuit according to an embodiment of the present invention applies.

Referring to FIG. 7, a memory system includes a controller 1000 and a flash memory 2000. A bus B1 transmits addresses, data and commands between the controller 1000 and the flash memory 2000.

The flash memory 2000 can adopt the sense amplifier circuit of FIG. 3 as a sense amplifier part 2100. Accordingly, the flash memory 2000 can operate at 1 V or less, and a sensing speed and power consumption can be properly designed to be suitable for the use. The memory system may include a data storage device, such as SSD.

Figure 8:
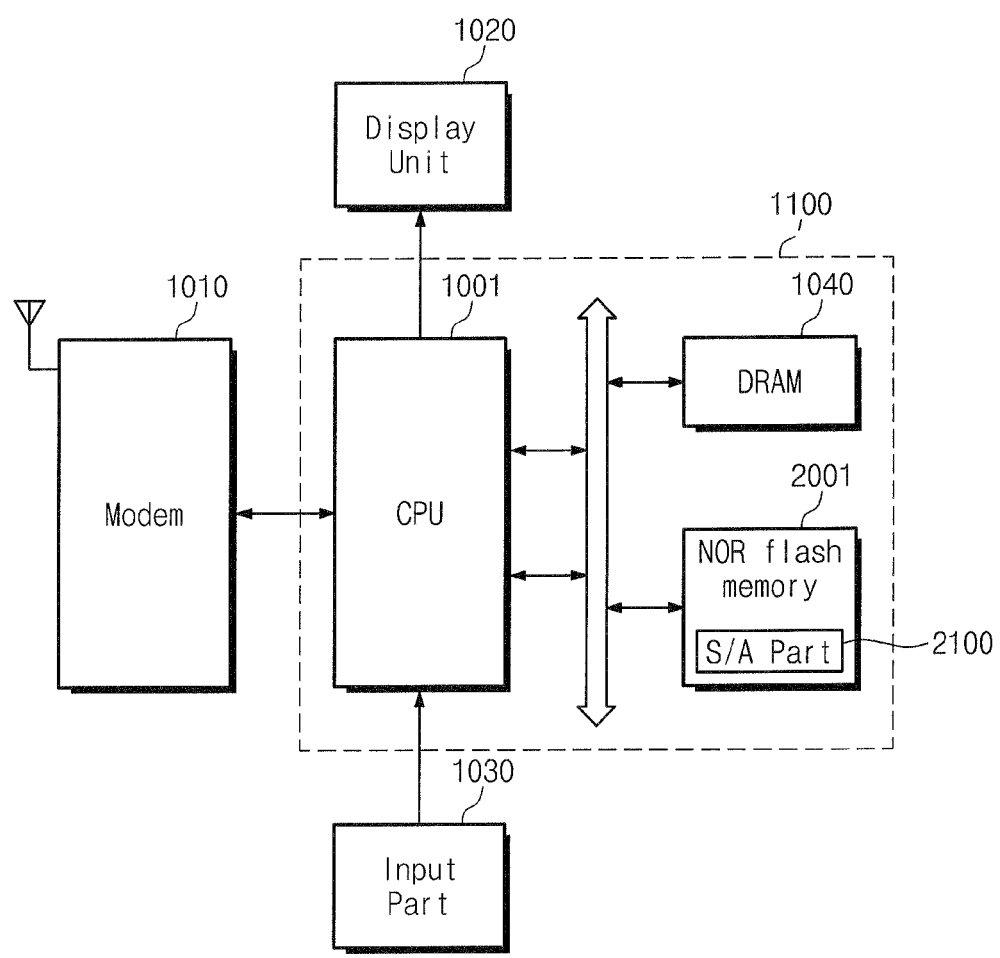
FIG. 8 is a block diagram illustrating an electronic device to which a sense amplifier circuit according to an embodiment of the present invention applies.

FIG. 8 is a block diagram illustrating an electronic device to which a sense amplifier circuit according to an embodiment of the present invention applies.

Referring to FIG. 8, the electronic device includes a modem 1010, a CPU 1001, a DRAM 1040, a NOR-type flash memory 2001, a display part 1020 and an input part 1030.

According to an embodiment, the CUP 1001, the DRAM 1040 and the NOR-type flash memory 2001 are manufactured or packaged in one chip 1100. According to an embodiment, the NOR-type flash memory 2001 is embedded in the electronic device.

The modem 1010 modulates or demodulates communication data.

The CPU 1001 controls an overall operation of the electronic device according to a program previously set.

The DRAM 1040 functions as a main memory of the CPU 1001 and may be a synchronous DRAM.

The NOR-type flash memory 2001 may include a nonvolatile semiconductor memory device adopting the sense amplifier circuit as a sense amplifier part 2100.

The display part 1020 includes a liquid crystal having a backlight, a liquid crystal having a LED light source or OLED and may have a touch screen. The display part 1020 functions as an output device that displays an image, such as characters, figures, or pictures.

The input part 1030 may include an input device including number keys, or function keys, and functions as an interface between the electronic device and a user.

Since the NOR-type flash memory 2001 adopts the sense amplifier circuit of FIG. 3 as the sense amplifier part 2100, the NOR-type flash memory 2001 can use a driving voltage of 1V or less. A sensing speed and power consumption can be properly designed to be suitable for the use and thereby performance of the electronic device increases.

The electronic device can function as a mobile communication device or a smart card by adding other elements or subtracting some of the constituent elements.

The electronic device may be connected via a separate interface to an external communication device. The external communication device may include a digital versatile disc player, a computer, a set top box, a game machine, or a digital camcorder.

According to an embodiment, the electronic device may further include an application chipset, a camera image processor, or a mobile DRAM.

The chip 1100 can be mounted in various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Although a flash memory is adopted in FIGS. 7 and 8, a nonvolatile storage may be used.

The storage can store data information having various data types, such as text, graphs, or software codes.

The storage may be embodied as, for example, an electrically erasable programmable read-only memory (EEPROM), a flash memory, a magnetic RAM (MRAM), a spin-transfer torque MRAM, a conductive bridging RAM, a ferroelectric RAM (FRAM), a phase change RAM (PRAM) that may be called an ovonic unified memory (OUM), a resistive RAM (RRAM), a nanotube RRAM, a polymer RAM, a nano floating gate memory (NFGM), a holographic memory, a molecular electronics memory device or an insulator resistance change memory.

According to the embodiments of the inventive concept, in a read operation, a low voltage drive operation is performed. A sensing speed and power consumption can be properly controlled to be suitable for the use.

Having described the exemplary embodiments of the inventive concept, it is further noted that it is readily apparent to those of reasonable skill in the art that various modifications may be made without departing from the spirit and scope of the inventive concept which is defined by the metes and bounds of the appended claims.

What is claimed is:

1. A sense amplifier circuit of a nonvolatile semiconductor memory device comprising:
   a reference voltage generator configured to output a reference voltage to a reference node depending on a current flowing through a reference data line connected to a reference bit line;
   a sensing voltage generator configured to output a sensing voltage to a sensing node depending on a current flowing through a data line connected to a bit line; and
   a comparator configured to sense and amplify a difference between the reference voltage of the reference node and the sensing voltage of the sensing node to detect data stored in a memory cell connected to the bit line,
   wherein the sensing voltage generator comprises:
      a first transistor connected between a power supply part and a clamping node;
      a second transistor which includes a gate and a drain connected to a gate of the first transistor and the sensing node, and a source connected to the power supply part;
      a third transistor which includes a drain connected to the drain of the second transistor;
      a fourth transistor which includes a drain-source channel connected between a source of the third transistor and a ground terminal, and a gate configured to receive a bias voltage; and
      an inverter configured to output an inverting output depending on a voltage of the clamping node to a gate of the third transistor.

2. The sense amplifier circuit of claim 1, wherein the sensing voltage generator comprises:
   a current supply part including the first transistor, wherein the current supply part is configured to be controlled by the sensing voltage of the sensing node; and
   a regulating control part including the second transistor, the third transistor, the fourth transistor, and the inverter, wherein the regulating control part is configured to regulate the voltage of the clamping node.

3. The sense amplifier circuit of claim 1, wherein first and second transistors are PMOS transistors, and the third and fourth transistors are NMOS transistors.

4. The sense amplifier circuit of claim 1, wherein the memory cell is included in a NOR flash memory cell array.

5. The sense amplifier circuit of claim 4, wherein the NOR flash memory cell array is built in a smart card.

6. The sense amplifier circuit of claim 1, wherein connection or disconnection between the bit line and the data line is performed by a column gate.

7. The sense amplifier circuit of claim 1, wherein when a voltage of the clamping node is set to 0.5V, a voltage of the power supply part is 0.9V or less.

8. The sense amplifier circuit of claim 1, wherein the inverter comprises:
   a PMOS transistor which includes a source connected to a first power supply voltage source and a gate configured to receive a bias voltage set; and
   a NMOS transistor which includes a gate connected to the clamping node and a drain-source channel connected between an output connection node to which a drain of the PMOS transistor is connected and a ground terminal.

9. The sense amplifier circuit of claim 1, wherein the comparator includes a current mirror type differential amplifier which includes a first input terminal connected to the sensing node and a second input terminal connected to the reference node, wherein the comparator is configured to be driven in response to an enable signal.

10. A nonvolatile semiconductor memory device comprising:
a memory cell array comprising memory cells arranged at intersections between a plurality of word lines and a plurality of bit lines;
a decoder configured to select a word line among the plurality of word lines and a bit line among the plurality of bit lines in the memory cell array; and
a sense amplifier circuit configured to sense data stored in a memory cell among the memory cells by detecting a current flowing through the selected bit line corresponding to the memory cell,
wherein the sense amplifier circuit comprises:
a reference voltage generator configured to output a reference voltage to a reference node depending on a current flowing through a reference data line connected to a reference bit line;
a sensing voltage generator configured to output a sensing voltage to a sensing node depending on a current flowing through a data line connected to the selected bit line; and
a comparator configured to sense and amplify a difference between the reference voltage of the reference node and the sensing voltage of the sensing node to detect data stored in the memory cell connected to the selected bit line,
wherein the sensing voltage generator comprises:
a load transistor connected between a power supply part and a clamping node;
a first PMOS transistor which includes a gate and a drain connected to the sensing node and a gate of the load transistor, and a source connected to the power supply part;
a first NMOS transistor which includes a drain connected to the drain of the first PMOS transistor; and
an inverter configured to output an inverting output depending on a voltage of the clamping node to a gate of the first NMOS transistor.

11. The nonvolatile semiconductor memory device of claim 10, wherein the load transistor is a PMOS transistor.

12. The nonvolatile semiconductor memory device of claim 11, wherein the sensing voltage generator further comprises
a second NMOS transistor which includes a drain-source channel connected between a source of the first NMOS transistor and a ground terminal, and a gate configured to receive a bias voltage.

13. The nonvolatile semiconductor memory device of claim 10, wherein the memory cell array includes a NOR flash memory cell array embedded in a system.

14. The nonvolatile semiconductor memory device of claim 10, wherein a current flowing through the reference data line of the reference voltage generator is determined by a reference cell connected to the reference bit line.

15. The sense amplifier circuit of claim 1, wherein the first transistor is directly connected to the clamping node.

16. A sense amplifier circuit of a semiconductor memory device comprising:
a reference voltage generator connected to a reference data line, wherein the reference voltage generator includes a current mirror having a first load transistor connected to the reference data line;
a sensing voltage generator connected to a data line, wherein the sensing voltage generator includes a current mirror having a second load transistor connected between a power supply part and the data line; and
a comparator configured to output sensing data in response to a reference voltage provided from the reference voltage generator and a sensing voltage provided from the sensing voltage generator,
wherein the sensing voltage generator further comprises:
a first transistor connected between a power supply part and a clamping node:
a second transistor which includes a gate and a drain connected to a gate of the first transistor and the sensing node, and a source connected to the power supply part;
a third transistor which includes a drain connected to the drain of the second transistor;
a fourth transistor which includes a drain-source channel connected between a source of the third transistor and a ground terminal, and a gate configured to receive a bias voltage; and
an inverter configured to output an inverting output depending on a voltage of the clamping node to a gate of the third transistor.

17. The sense amplifier of claim 16, wherein the first load transistor of the current mirror in the reference voltage generator is configured to be controlled by the reference voltage.

18. The sense amplifier of claim 16, wherein the second load transistor of the current mirror in the sensing voltage generator is configured to be controlled by the sensing voltage.

19. The sense amplifier of claim 16, wherein the comparator is a differential amplifier.

* * * * *